(12) United States Patent
Lei

(10) Patent No.: US 10,498,357 B2
(45) Date of Patent: Dec. 3, 2019

(54) METHOD, APPARATUS, SYSTEM, AND COMPUTER PROGRAM PRODUCT FOR DATA COMPRESSION

(71) Applicant: BEIJING BYTEDANCE NETWORK TECHNOLOGY CO., LTD., Haidian District, Beijing (CN)

(72) Inventor: Peng Lei, Beijing (CN)

(73) Assignee: BEIJING BYTEDANCE NETWORK TECHNOLOGY CC, Beijing (CN)

( * ) Notice: Subject to any disclaimer, the term of this patent is extended or adjusted under 35 U.S.C. 154(b) by 479 days.

(21) Appl. No.: 15/444,256

(22) Filed: Feb. 27, 2017

(65) Prior Publication Data

US 2017/0255670 A1 Sep. 7, 2017

Related U.S. Application Data

(60) Provisional application No. 62/318,780, filed on Apr. 6, 2016.

(30) Foreign Application Priority Data

Mar. 2, 2016 (CN) .......................... 2016 1 0118629

(51) Int. Cl.
H03M 7/30 (2006.01)
(52) U.S. Cl.
CPC ....... H03M 7/3097 (2013.01); H03M 7/3091 (2013.01); H03M 7/55 (2013.01)
(58) Field of Classification Search
CPC ..... H03M 7/3079; H03M 7/55; H03M 7/3091
USPC ...................................................... 341/50–75
See application file for complete search history.

(56) References Cited

U.S. PATENT DOCUMENTS

| 5,412,384 | A | * | 5/1995 | Chang | G06T 9/005 |
| | | | | | 341/51 |
| 5,737,732 | A | * | 4/1998 | Gibson | G06F 16/322 |
| 6,785,687 | B2 | * | 8/2004 | Baskins | G06F 16/9027 |
| 7,007,101 | B1 | * | 2/2006 | Schwaderer | H04L 45/00 |
| | | | | | 370/395.31 |
| 7,180,887 | B1 | * | 2/2007 | Schwaderer | H04L 45/742 |
| | | | | | 370/351 |
| 7,460,033 | B2 | * | 12/2008 | Iyer | H03M 7/3088 |
| | | | | | 341/107 |
| 9,286,313 | B1 | * | 3/2016 | Sharangpani | G06F 16/258 |

(Continued)

*Primary Examiner* — Lam T Mai
(74) *Attorney, Agent, or Firm* — Jun He Law Offices P.C.; James J. Zhu

(57) ABSTRACT

According to one aspect of the present application, a method for data compression comprises: creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge; collecting edges of the first trie longer than a predetermined length and making these edges a first subset of strings of the first trie; segmenting a string in the first subset of strings into two or more fragments when the string satisfies a predetermined condition and collecting all segmented fragments and all un-segmented strings in the first subset of strings as a segmented set of strings; and storing the first set of strings using the first trie and the segmented set of strings so as to compress the raw data strings.

38 Claims, 9 Drawing Sheets

(56) References Cited

U.S. PATENT DOCUMENTS

| | | | |
|---|---|---|---|
| 9,754,594 B2* | 9/2017 | Liu ........................ | G10L 19/002 |
| 2006/0004744 A1* | 1/2006 | Nevidomski ..... | G06F 16/90344 |
| 2011/0243197 A1* | 10/2011 | Atarashi ................ | H04B 1/692 |
| | | | 375/146 |
| 2014/0280318 A1* | 9/2014 | Simms .................... | G06F 16/29 |
| | | | 707/769 |
| 2017/0288694 A1* | 10/2017 | Kataoka .............. | H03M 7/3088 |

* cited by examiner

5 – romulus
8 – romane
9 – romanus
10 – rubens
11 – ruber
12 – rubicon
13 – rubicundus

| No. | Search Keywords | Search Suggestions (URL Lists) |
|---|---|---|
| 1 | XuSongQin | http://baike.haosou.com/doc/4295168.html<br>http://baike.baidu.com/view/3963365.html |
| 2 | XuSongRong | http://baike.haosou.com/doc/1726248.html<br>http://baike.baidu.com/view/2064328.html |
| 3 | XuSongQing | http://baike.haosou.com/doc/4195522-4396397.html<br>http://baike.haosou.com/doc/4195522-4396403.html<br>http://baike.sogou.com/v64962627.htm<br>http://baike.sogou.com/v64962625.htm<br>http://baike.baidu.com/view/3883500.html |

Fig. 6

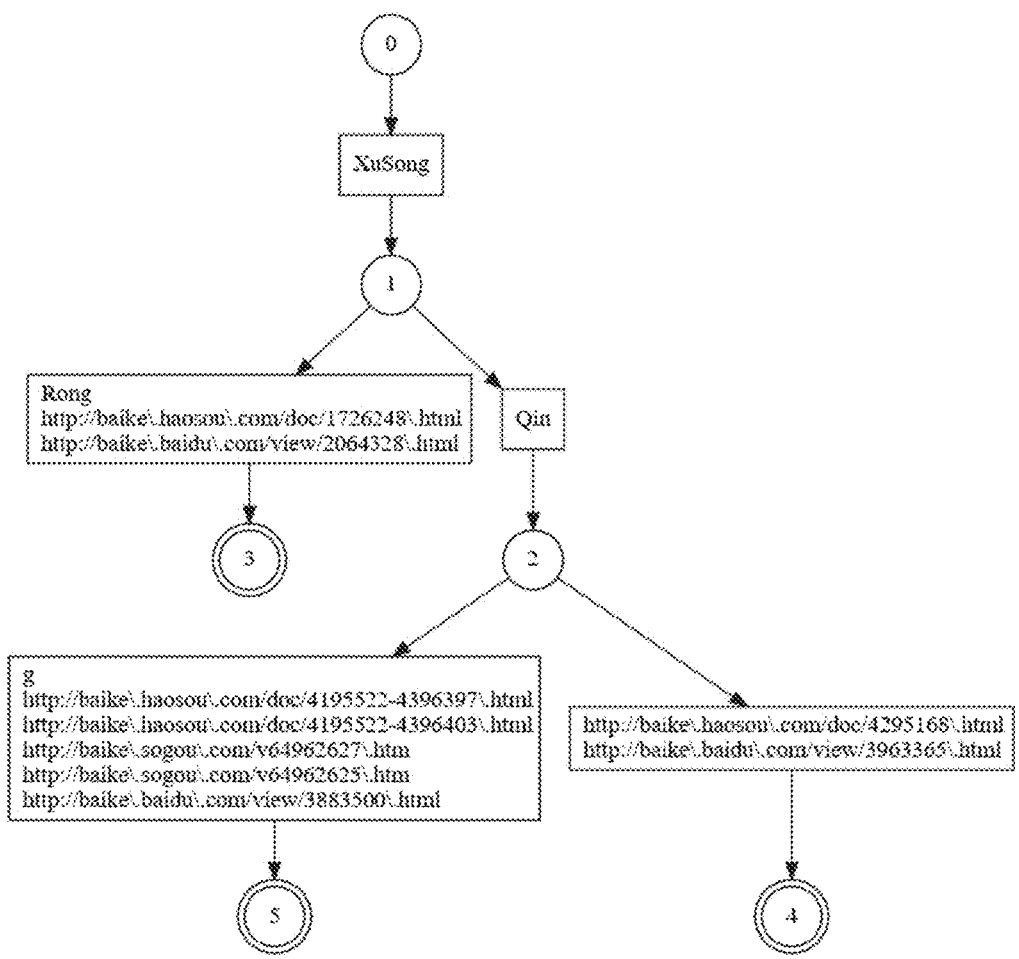

Fig. 7

| No. | Elements in the Segmented Set of Strings |
|---|---|
| 1 | Qin\t |
| 2 | Rong\t |
| 3 | Xusong |
| 4 | http://baike.haosou.com/doc/4295168.html |
| 5 | http://baike.baidu.com/view/3963365.html |
| 6 | http://baike.haosou.com/doc/1726248.html |
| 7 | http://baike.baidu.com/view/2064328.html |
| 8 | http://baike.haosou.com/doc/4195522-4396397.html |
| 9 | http://baike.haosou.com/doc/4195522-4396403.html |
| 10 | http://baike.sogou.com/v64962627.htm |
| 11 | http://baike.sogou.com/v64962625.htm |
| 12 | http://baike.baidu.com/view/3883500.html |

Fig. 10

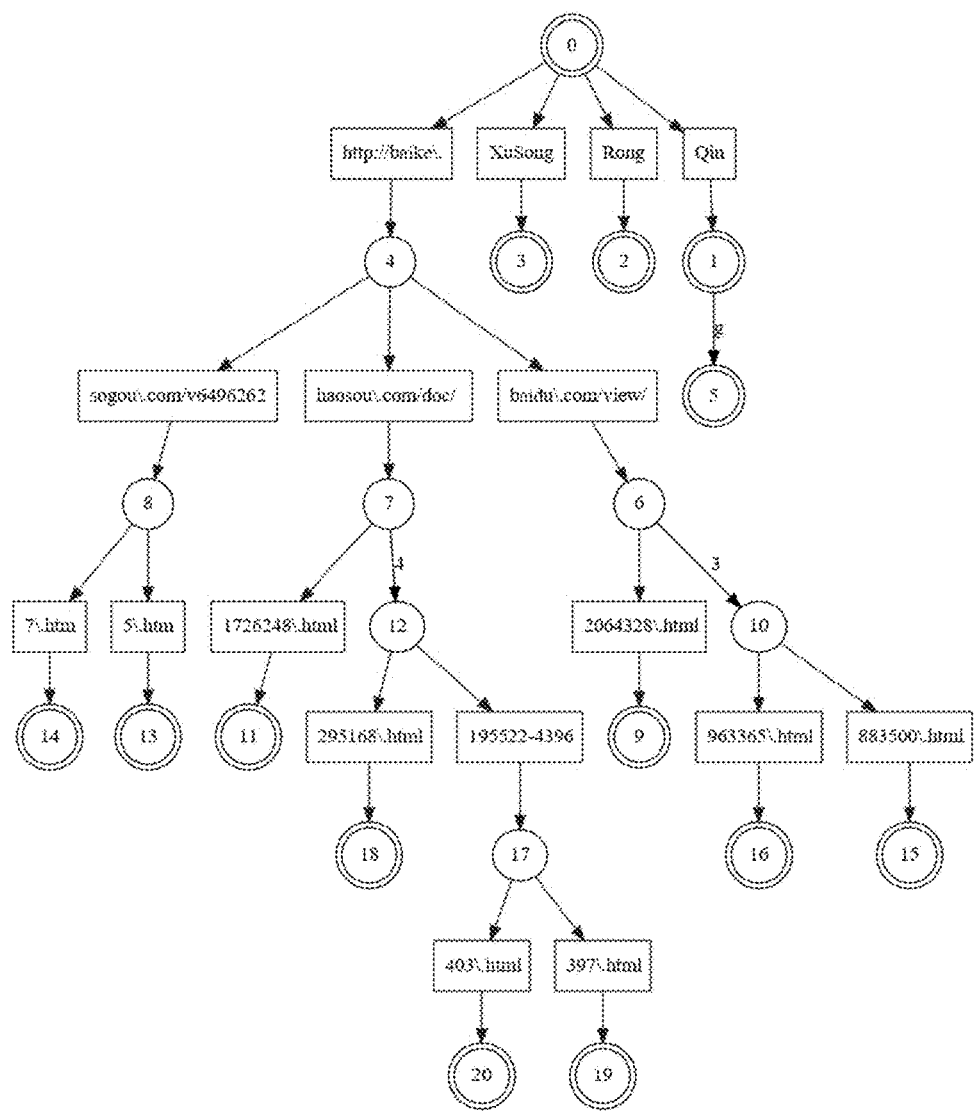

Fig. 11

| Before Reversal | After Reversal | Notes |
|---|---|---|
| http://baike. | .ekiab//:ptth | |
| haosou.com/doc/ | /cod/moc.uosoah | |
| baidu.com/view/ | /weiv/moc.udiab | |
| sogou.com/v6496262 | 2626946v/moc.uogos | |
| 195522-4396 | 6934-225591 | |
| 883500.html | lmth.005388 | |
| 403.html | lmth.304 | The original suffix ".html" is reversed to prefix "lmth.", which is shared among strings. |
| 963365.html | lmth.563369 | |
| 397.html | lmth.793 | |
| 2064328.html | lmth.8234602 | |
| 1726248.html | lmth.8426271 | "8.html" is reversed and shared. |
| 295168.html | lmth.861592 | |
| 5.htm | mth.5 | ".htm" is reversed and shared. |
| 7.htm | mth.7 | |
| Rong | gnoR | "ong" is reversed and shared |
| XuSong | gnoSuX | |
| Qin | niQ | |

Fig. 12

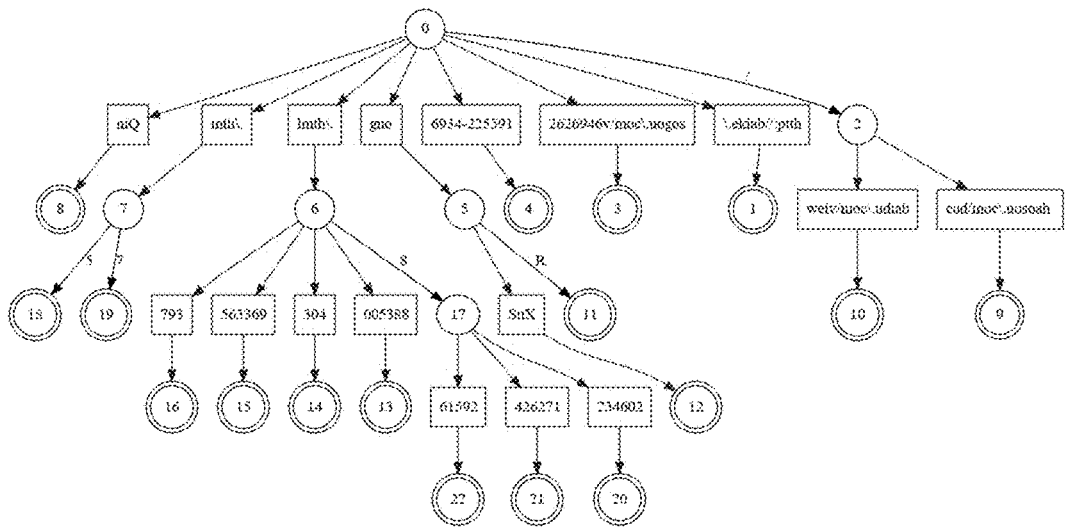

Fig. 13

| Offset | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| Character | f | a | s | t | e | s | t | c | o | m | p | u | t | e | r | s | o | f | t | w | a | r | e |

Fig. 14

| No. | Offset | Length | String |
|---|---|---|---|
| 1 | 0 | 4 | fast |
| 2 | 0 | 7 | fastest |
| 3 | 0 | 15 | fastest computer |
| 4 | 0 | 23 | fastest computer software |
| 5 | 4 | 4 | test |
| 6 | 4 | 12 | test computer |
| 7 | 7 | 3 | com |
| 8 | 7 | 7 | compute |
| 9 | 7 | 8 | computer |
| 10 | 7 | 16 | computer software |
| 11 | 8 | 3 | omp |
| 12 | 10 | 5 | puter |
| 13 | 12 | 5 | terso |
| 14 | 13 | 6 | ersoft |
| 15 | 13 | 10 | ersoftware |
| 16 | 15 | 2 | so |
| 17 | 15 | 4 | soft |
| 18 | 15 | 8 | software |
| 19 | 19 | 4 | ware |
| 20 | 20 | 3 | are |

Fig. 15

METHOD, APPARATUS, SYSTEM, AND COMPUTER PROGRAM PRODUCT FOR DATA COMPRESSION

CROSS REFERENCE TO RELATED APPLICATIONS

This application claims priority to Chinese Patent Application No. 201610118629.5 filed on Mar. 2, 2016 and U.S. Patent Application No. 62/318,780 filed on Apr. 6, 2016, the entire content of which are incorporated herein by reference.

FIELD OF THE INVENTION

The present application relates to the field of database, and more specifically, to compressing data using a trie compressing technology.

BACKGROUND OF THE INVENTION

Data retrieval refers to obtaining data from a database by using a database management system (DBMS). Different forms of data retrieval technologies are suitable for different types of applications and some forms of data storage are particularly suitable for implementing certain specific tasks.

For example, a tree data structure is a commonly-used form of non-linear data retrieval technique. A tree is represented as a set of linked nodes to describe a hierarchical data set.

The following terms are generally used in the tree structure.
Root—The top node in a tree.
Child—A node directly connected to another node when moving away from the Root.
Parent—The converse notion of a child.
Descendant—A node reachable by repeated proceeding from parent to child.
Ancestor—A node reachable by repeated proceeding from child to parent.
Leaf/External Node—A node with no children.
Internal node—A node with at least one child.
Edge—Connection between one node to another. Under certain circumstances, an edge corresponds to a condition (e.g. an input key), which triggers a state transition from one node to another node.
Subtree—For a node in a tree, a subtree is formed by the node and all of its descendants.

On the basis of tree data retrieval, recent developments in the area of data compression are described as follows.

Trie

A trie, also called a prefix tree, is one type of tree data structure. In a trie, all the descendants of a node have a common prefix of the string associated with that node and the common prefix is the string associated with the node. The root is associated with an empty string. Furthermore, no node in a trie stores the key associated with that node; instead, the position of a node in the trie defines the key which the node is associated with. In addition, each node corresponds to an edge linked from its parent node.

Typically, a regular trie has the following basic characteristics: 1) each node, except the root, corresponds to an edge; 2) a character associated with a node is labeled on the corresponding edge of the node, and the set of characters labeled on the path from the root to a node forms a string (i.e. key) associated with the node; and 3) all children of a node are associated with different characters.

FIG. 1 depicts an example of a trie. In this example, the trie consists of seven data strings: "abc", "abcd", "abd", "b", "bcd", "efg", and "hii". In FIG. 1, a double circle node shown in the trie denotes that the node is a final state, which means the node contains a valid string of a set of strings, and a single circle node shown in the trie denotes that the node is not a final state.

The following basic operations are typically supported in a trie.

Forward Search: this operation determines if or not a known string exists in a trie. Forward search starts from the root in a trie to search for the first character of the known string and search continues by going to a respective subtree through an edge associated with the first character; the second character of the string is searched for in the subtree and search continues by selecting another edge associated with the second character and going to another subtree; the above search operation is performed iteratively until all characters of the string are found at a certain node, and information on this node may be retrieved to complete the forward search; otherwise, the forward search ends without finding the known string.

Reverse Search: this operation retrieves a string of which the location in the trie is known. Reverse search starts from any node in a trie and the known path from the starting node to the root is traversed to obtain a corresponding string. The obtained string is reversed so that the string matching the known path is retrieved.

Insertion: first, a location in a trie to insert a node is determined by performing forward search based on the string to be inserted to the trie. If the complete path corresponding to the string to be inserted does not exist in the trie, one or more new nodes corresponding to the remaining characters are created at the determined location in the trie; if the complete path already exists in the trie, the corresponding node is set as being a final state, i.e. the string associated with the node exists in the trie.

Deletion: first, a location in a trie to delete a node is determined based on the string to be deleted from the trie. If the determined node is a leaf, deletion operation is performed iteratively until all leaves associated with the to-be-deleted string are removed; if the determined node is an internal node, this node is set as being a non-final state, i.e. the string associated with the node does not exist in the trie anymore.

It should be noted that, in traditional tries represented with pointers, merely pointers pointing from parent nodes to child nodes are stored, thereby supporting only forward search in a trie. If reverse search shall be supported in this type of pointer-based tries, an additional set of pointers pointing from children nodes to parent nodes need to be stored and, thus, extra storage space has to be used.

A trie may be used to replace other forms of data storage such as a hash table. A common application of a trie is storing texts or dictionary, such as that found on a mobile telephone. It is understandable that a trie uses common prefixes among strings to reduce data redundancy and minimize senseless comparison in various operations. However, a trie becomes inefficient when it is used to store a large amount of strings that do not have common prefixes substantially.

Compressed Trie

A trie may be further compressed. A feasible way to implement trie compression is to compress edges in a trie, that is, to merge nodes in the trie satisfying a predetermined condition. A trie compressed through node merge may be referred as a PATRICIA (Practical Algorithm To Retrieve Information Coded In Alphanumeric) trie.

A PATRICIA trie optimizes the nodes' space. Specifically, in a PATRICIA trie, two nodes may merge to one node if one of the two nodes is the only child of the other node. As such, some edges in a PATRICIA trie may be labeled with strings having more than one character.

FIG. 2 depicts an example of a PATRICIA trie. In this example, the trie also consists of seven strings: "romane", "romanus", "romulus", "rubens", "ruber", "rubicon", and "rubicundus". As shown in FIG. 2, nodes satisfying the above-mentioned condition are merged and corresponding edges are compressed. For example, the compressed edge between a leaf (i.e. Node 5) and its parent (i.e. Node 2) is labeled with the string "ulus". It should be noted that, in some implementations, additional requirements may be applied to the merge condition. For example, it may be required that node merge is made only when the number of characters corresponding to the nodes to be merged reaches a predetermined number, that is, the edge is longer than a predetermined length (e.g. 2).

A PATRICIA trie is suitable for a string set of which the strings have long common prefixes. For example, PATRICIA trie is particularly suitable for IP address management in the area of IP routing.

Succinct Data Compression

A succinct data structure is a type of data structure that may be used to implement lossless data compression algorithms. Through data compression, a succinct structure uses an amount of space that is close to information-theoretic lower bound, but still allows for efficient query operations. Unlike general lossless data compression algorithms, succinct data structures retain the ability to use the data "in-place" without decompressing the data first.

A succinct data structure may be defined from the perspective of space complexity. Suppose that Z is the information-theoretical optimal number of bits needed to store some data. A representation of this data is called "succinct" if it takes $Z+o(Z)$ bits of space to store this data, where $o(Z)$ denotes space complexity. Accordingly, a data structure that uses $Z+\sqrt{Z}$ bits of storage is succinct and another data structure that uses $Z+\lg Z$ of bits is also succinct.

Succinct indexable dictionaries, also called rank/select dictionaries, form the basis of a number of succinct representation techniques. In this type of dictionaries, a subset S of a universe $U=[0 \ldots n)=\{0, 1, \ldots, n-1\}$ is stored. The subset S is usually represented as a bit array $B[0 \ldots n)$, where $B[i]=1$ when and only when $i \in S$.

In addition to usual methods on dictionaries such as queries and insertions/deletions, an indexable dictionary also supports two special operations, i.e. rank and select:

$rank_q(x)=|\{k \in [0 \ldots x]:B[k]=q\}|$; and
$select_q(x)=min\{k \in [0 \ldots n):rank_q(k)=x\}$
for $q \in \{0, 1\}$.

In other words, $rank_q(x)$ returns the number of elements equal to q up to position x while $select_q(x)$ returns the position of the x-th occurrence of q.

As mentioned above, succinct indexable dictionaries form the basis of a number of succinct representation techniques. Accordingly, for example, data structures such as binary trees, k-ary trees, multisets, and suffix trees/arrays may be represented by a succinct data structure. As a specific example, an arbitrary binary tree of n nodes can be represented by $2n+o(n)$ bits in the succinct representation.

LOUDS Trie

A LOUDS (Level-Order Unary Degree Sequence) trie is a trie implemented by the succinct representation. In a LOUDS trie, no pointers are used to store locations of nodes. Instead, a trie is encoded in a succinct bit array string to achieve an efficient representation of the trie structure.

A LOUDS bit string may be created as follows. Starting from the root, a trie is traversed in breadth-first order, i.e. all nodes at the same level are traversed before going to the next level. When it is found that a node has d children (d>0), d "1"s and one "0" are used to represent this node. Accordingly, a leaf may be represented by a "0". In addition, a prefix "10" is added to the LOUDS bit string and the prefix represents an imaginary super root pointing to the root. It thus can be seen that an n-node LOUDS trie consumes 2n+1 bits to represent the trie structure. FIG. 3 depicts an example of a LOUDS trie created in accordance with the rules described above.

In addition, a LOUDS trie may also use an n-bit array (e.g. the bit array B described above with respect the succinct data structure) to store whether a node in the trie is a final state. It thus can be seen that the LOUDS representation may be used to implement the structure of any trie including the PATRICIA trie and a LOUDS-implemented trie stratifies the storage requirement as specified by the succinct structure, i.e. $Z+o(Z)$. Further, an n-byte array may be used to store the transition characters on the edges of an uncompressed n-node trie.

Through the rank and select operations of the succinct data structure, a LOUDS trie supports finding the parent (get parent) and any child (get $n^{th}$ child) for a node in the trie. Accordingly, in a LOUDS trie, both forward search and reverse search may be performed more efficiently than the traditional pointer-based approach.

Based on the above description, those skilled in the art would appreciate that a trie may be compressed by merging nodes in the trie and the LOUDS representation may be used to represent the structure of a trie to support efficient forward search and backward search.

However, data redundancy may still exist in a node-merged trie. As in the example of FIG. 2, it can be found that a common prefix "u" exists among the string "ub" on the compressed edge from Node 1 to Node 3, the string "ulus" on the compressed edge from Node 2 to Node 5, the string "us" on the compressed edge from Node 4 to Node 9, and the string "undus" from Node 7 to Node 13. Similarly, a common prefix "o" exists between the strings "om" and "on" in the trie of FIG. 2. Thus, the storage space efficiency of a trie may be improved if redundancy in a compressed trie (e.g. a PATRICIA trie) can be further reduced.

SUMMARY OF THE INVENTION

According to one aspect of the present application, a method for data compression comprises: creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge; collecting edges of the first trie longer than a predetermined length and making these edges a first subset of strings of the first trie; segmenting a string in the first subset of strings into two or more fragments when the string satisfies a predetermined condition and collecting all segmented fragments and all un-segmented strings in the first subset of strings as a segmented set of strings; and storing the first set of strings using the first trie and the segmented set of strings so as to compress the raw data strings.

According to another aspect of the present application, an apparatus for data compression comprises: means for creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge; means for collecting edges of the first trie longer than a predetermined length and making these edges a first subset of strings of the first trie; means for segmenting a string in the first subset of strings into two or more fragments when the string satisfies a predetermined condition and collecting all segmented fragments and all unsegmented strings in the first subset of strings as a segmented set of strings; and means for storing the first set of strings using the first trie and the segmented set of strings so as to compress the raw data strings.

According to another aspect of the present application, a system for data compression comprises: a trie creation unit (1601) creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge, wherein edges of the first trie longer than a predetermined length are collected to form a first subset of strings of the first trie; a determination/segmentation unit (1602) segmenting a string in the first subset of strings into two or more fragments when the string satisfies a predetermined condition, wherein all segmented fragments and all unsegmented strings in the first subset of strings are collected to form a segmented set of strings of the first trie; a string storage unit (1603) storing the segmented set of strings; and a trie storage unit (1604) storing the first trie.

According to another aspect of the present application, an apparatus for data compression comprises a memory and a processor coupled to the memory. The processor is configured to: create a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge; collect edges of the first trie longer than a predetermined length and make these edges a first subset of strings of the first trie; segment a string in the first subset of strings into two or more fragments when the string satisfies a predetermined condition and collect all segmented fragments and all unsegmented strings in the first subset of strings as a segmented set of strings; and store the first set of strings using the first trie and the segmented set of strings so as to compress the raw data strings.

According to another aspect of the present application, a computer program product for data compression comprises a non-transitory computer-readable medium. The non-transitory computer-readable medium comprises computer-executable codes for: creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge; collecting edges of the first trie longer than a predetermined length and make these edges a first subset of strings of the first trie; segmenting a string in the first subset of strings into two or more fragments when the string satisfies a predetermined condition and collecting all segmented fragments and all unsegmented strings in the first subset of strings as a segmented set of strings; and storing the first set of strings using the first trie and the segmented set of strings so as to compress the raw data strings.

The foregoing has outlined, rather broadly, features of the present application. Additional features of the present application will be described hereinafter, which form the subject of the claims of the present application. It should be appreciated by those skilled in the art that the conception and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

BRIEF DESCRIPTION OF DRAWINGS

The aforementioned features and other features of the application will be further described in the following paragraphs by referring to the accompanying drawings and the appended claims. It will be understood that, the accompanying drawings merely illustrate certain embodiments in accordance with the present application and should not be considered as limitation to the scope of the present application. Unless otherwise specified, the accompanying drawings need not be proportional, and similar reference characters generally denote similar elements.

FIG. 6 depicts an exemplary string set including search keywords and search suggestions (URL lists).

FIG. 7 depicts a compressed trie corresponding to the exemplary string set of FIG. 6.

FIG. 10 depicts an exemplary result of segmentation on a set of strings according to embodiments of the present application.

FIG. 11 depicts a compressed second-layer trie corresponding to the segmented set of strings of FIG. 10.

FIG. 12 depicts an exemplary reversal of a set of strings according to embodiments of the present application.

FIG. 13 depicts a compressed third-layer trie corresponding to the reversed set of strings of FIG. 12.

FIG. 14 depicts an example of a string array according to embodiments of the present application.

FIG. 15 depicts an example of using the string array of FIG. 14 to represent multiple strings.

DETAILED DESCRIPTION OF THE EMBODIMENTS

The following detailed description refers to the accompanying drawings as a part of the present application. The illustrative embodiments described in the detailed description, the accompanying drawings and the claims are not limiting, and other embodiments may be adopted, or modifications may be made without deviating from the spirit and subject of the application. It would be appreciated that the various aspects of the application described and graphically presented herein may be arranged, replaced, combined, divided and designed in many different configurations, and these different configurations are implicitly comprised in the application.

As described above, in a node-merged PATRICIA trie, redundancy of data strings may still exist among different compressed edges. In view of the problem, a "nesting" operation may be implemented to further compress the trie structure.

In the nesting operation, a first PATRICIA trie ($Trie_1$) is created according to an initial set of raw data strings ($Strset_1$). The data strings labeled on the compressed edges in $Trie_1$ are collected to make a second set of strings ($Strset_2$). Then, a second PATRICIA trie ($Trie_2$) is created according to $Strset_2$. The nodes in $Trie_1$ corresponding to the collected edges consisting of said second set of strings $Strset_2$ are associated with the respective nodes in $Trie_2$. Consequently, a nested structure of two PATRICIA tries may be created.

Figure 1:
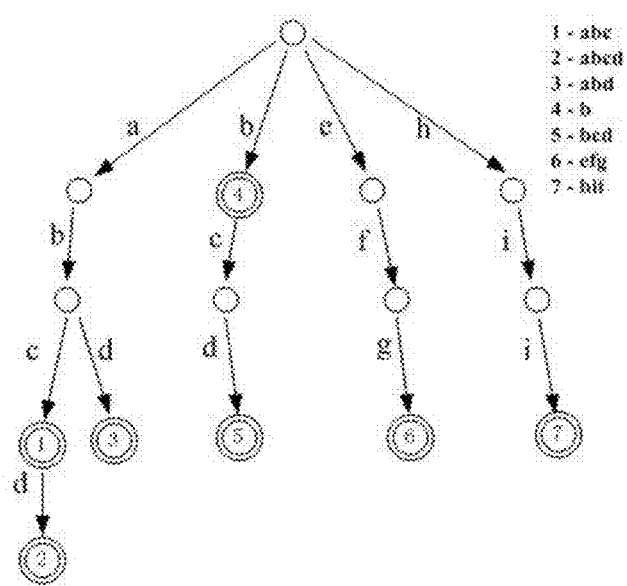
FIG. 1 depicts an example of a regular trie.
Figure 2:
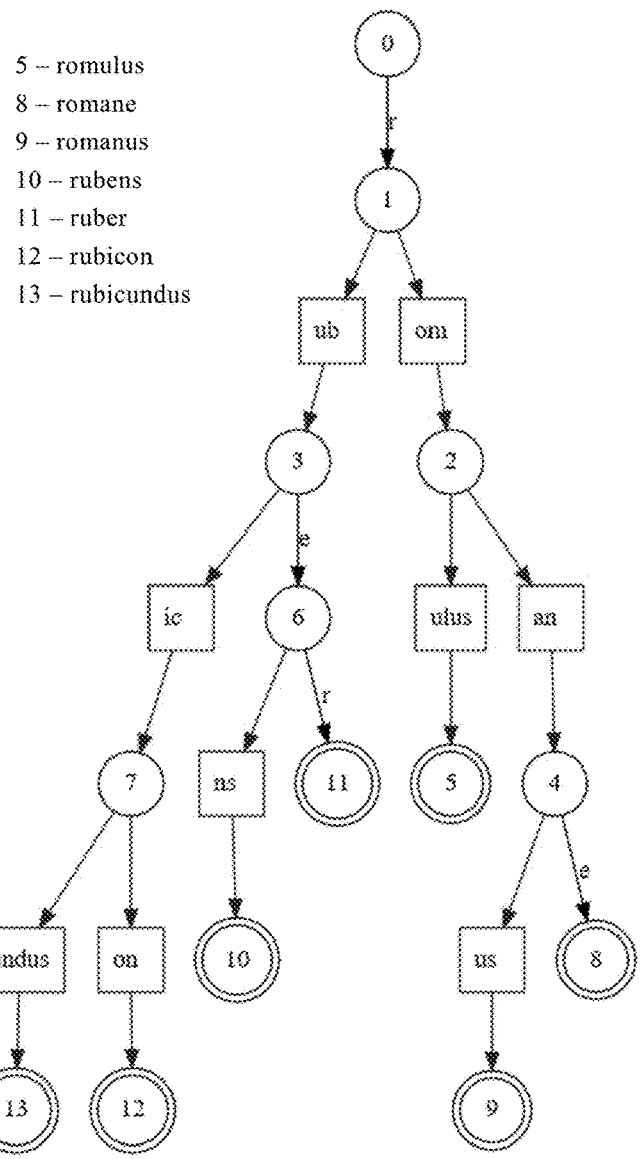
FIG. 2 depicts an example of a compressed trie.
Figure 3:
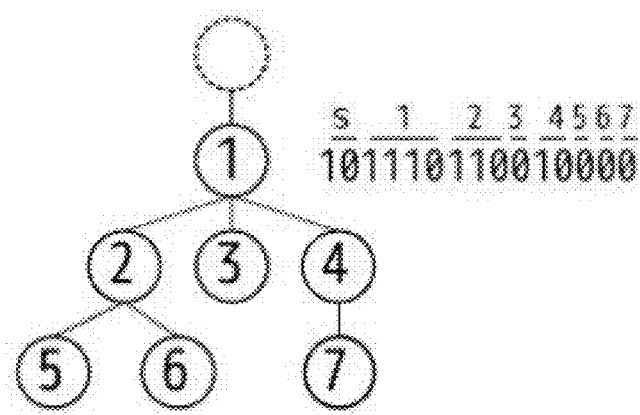
FIG. 3 depicts an example of a LOUDS trie.
Figure 4:
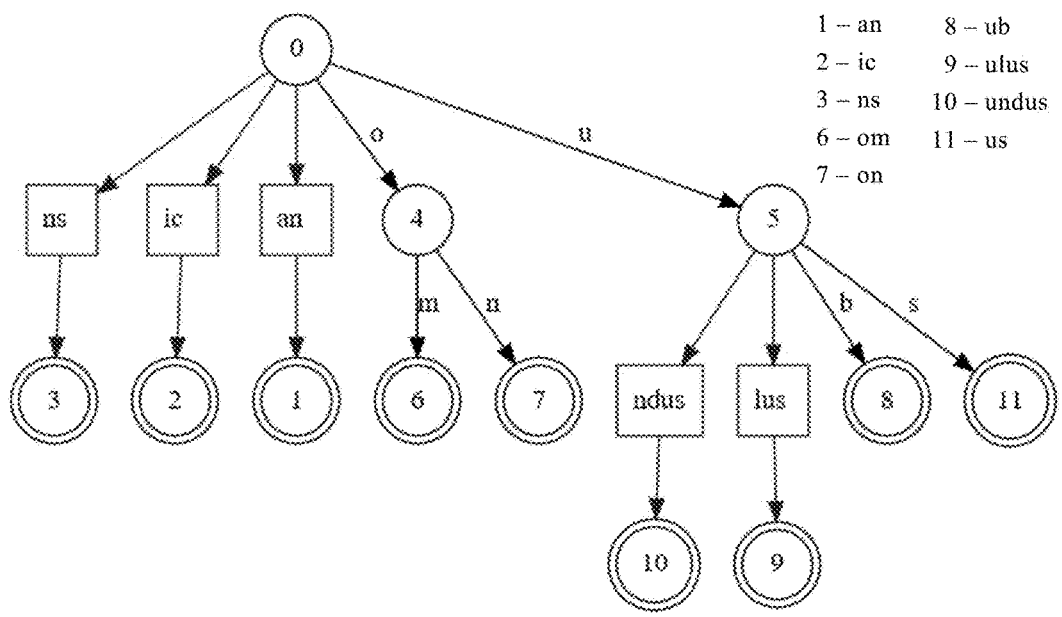
FIG. 4 depicts a compressed inner-layer trie in an exemplary nested structure.

FIG. 4 depicts an inner-layer PATRICIA trie (i.e. $Trie_2$) generated by implementing nesting operation based on the PATRICIA trie (i.e. $Trie_1$) as shown in FIG. 2. Specifically, in this example, in order to create $Trie_2$, $Strset_2$ is provided by collecting strings having two or more characters labeled on respective edges of $Trie_1$, i.e. "om", "ub", "ulus", "an", "ic", "us", "ns", "on", and "undus". Then, $Trie_2$ is created based on $Strset_2$. Pointers (e.g. integer IDs) pointing to corresponding nodes (e.g. leaf nodes) in $Trie_2$ may be stored at respective child nodes in $Trie_1$ where the strings in $Strset_2$ are collected. Accordingly, reverse search starting from $Trie_2$ may be implemented to retrieve each raw data string in $Strset_1$.

In some embodiments, if long edges (e.g. longer than a predetermined length) still exist in $Trie_2$, nesting operation as described above may be continued in an iterative manner so as to create a compressed trie at an inner layer.

Figure 5:
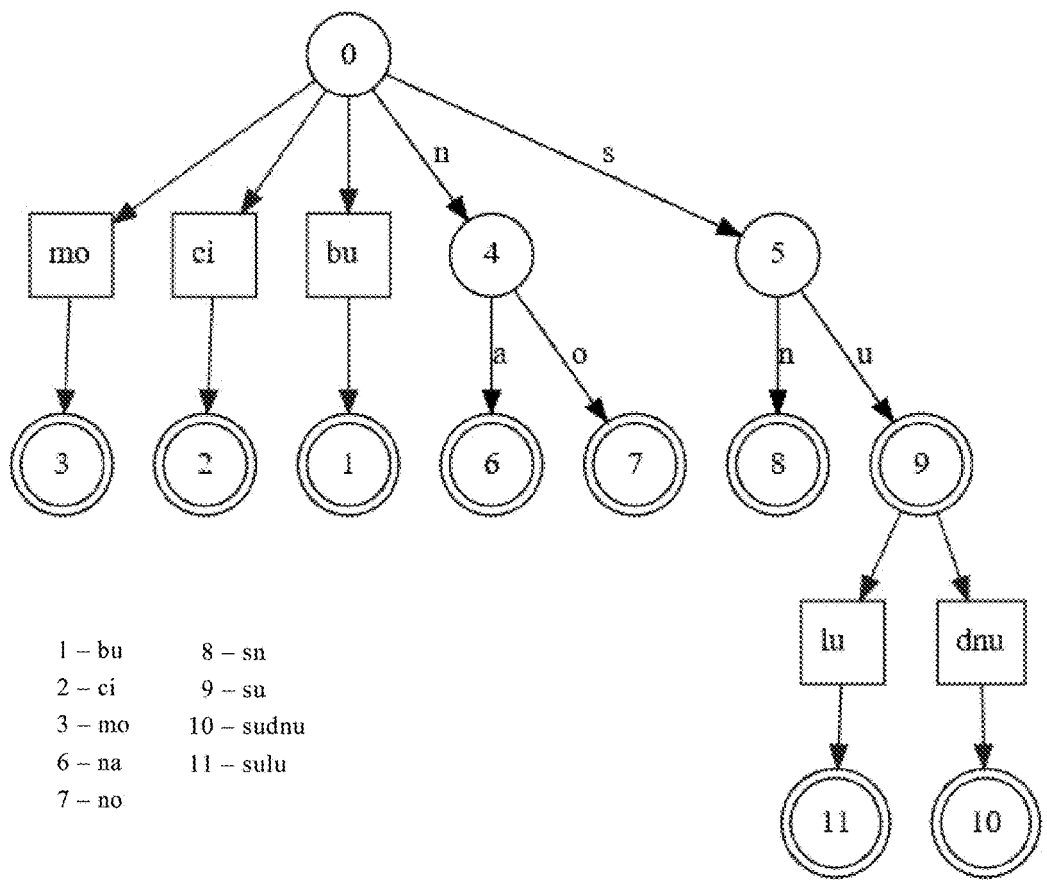
FIG. 5 depicts another compressed inner-layer trie in the exemplary nested structure.

For certain data types, strings may have many common suffixes, e.g. Chinese phonetic alphabets such as "tang", "zhang", "wang", etc. In such cases, a string may be reversed before it is collected in a string set of a compressed trie. As in the example described above, each of the strings in $Strset_2$ may first be reversed so as to form a new set of strings ($Strset_2'$), which thus includes "mo", "bu", "sulu", "na", "ci", "su", "sn", "no", and "sudnu". $Strset_2'$ may then be used to create another inner-layer PATRICIA trie ($Trie_2'$), which is depicted in FIG. 5. Compared with $Trie_2$, $Trie_2'$ has more common prefixes, thereby improving the efficiency of data compression. It should be appreciated that the above example is only illustrative and the effect of string reversal will become more evident in many practical applications where the number of data strings is huge.

In general, nested tries may be more space-efficient than un-nested tries. However, in certain applications, when a data string corresponding to an edge is extraordinarily long, space efficiency of a PATRICIA trie still cannot be effectively improved merely through nesting operation.

The table in FIG. 6 depicts an exemplary application of Uniform Resource Locator (URL or commonly informally termed as "web address") search. As an example, in URL search, data may be stored in the form of search keywords and search suggestions (URL lists), e.g. "keyword \t URL1 URL2 URL3 . . . " in which "\t" denotes a tab character and multiple URLs are separated by one or more spaces. As shown in FIG. 6, the string set consists of three data entries, each of which in turn consists of a long string of characters including the name of a person in Chinese phonetic alphabets as a search keyword and a list of corresponding URLs as search suggestions. Because the three data entries (i.e. long strings) share the common prefix of "XuSong", this prefix may be merged when a trie is created for the set of strings.

FIG. 7 depicts a PATRICIA trie ($Trie_1$) created based on the set of three long strings as described above. As shown in FIG. 7, the three strings have a common prefix "XuSong" and two of the three strings further have a common prefix "Qin".

Figure 8:
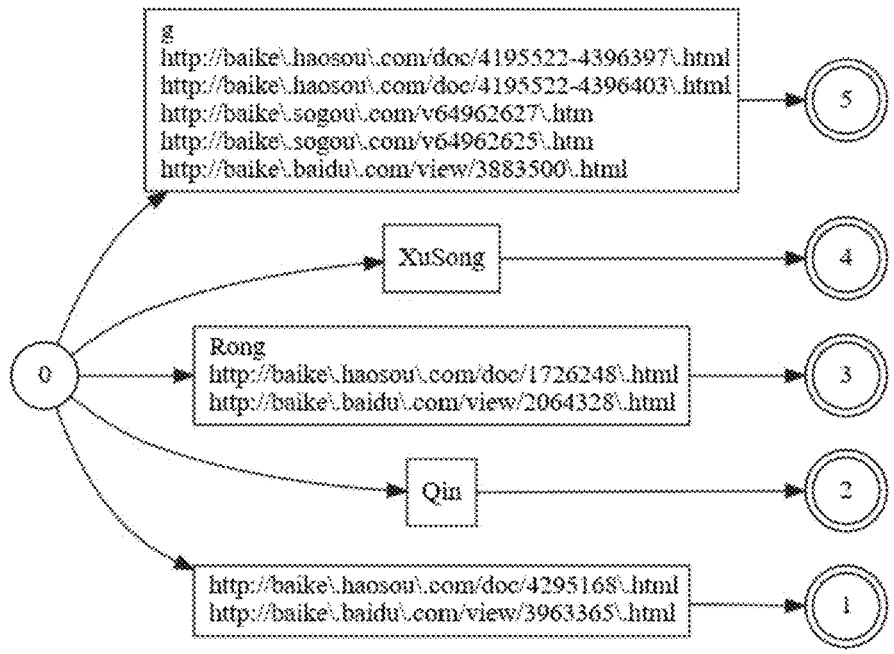
FIG. 8 depicts a compressed inner-layer trie corresponding to the exemplary string set of FIG. 6.

Further, FIG. 8 depicts an inner-layer PATRICIA trie ($Trie_2$) created by performing nesting operation on $Trie_1$. It can be seen in FIG. 8 that the nesting operation does not improve space efficiency of the trie because the three long strings in $Trie_2$ no longer have a common prefix. Rather, efficiency of the nested structure may even decrease in the above example as additional space is needed to store the links between nodes in different tries.

In view of the above problem, the present application proposes to segment certain strings that meet predetermined conditions, and then create compressed tries based on the segmented strings.

Figure 9:
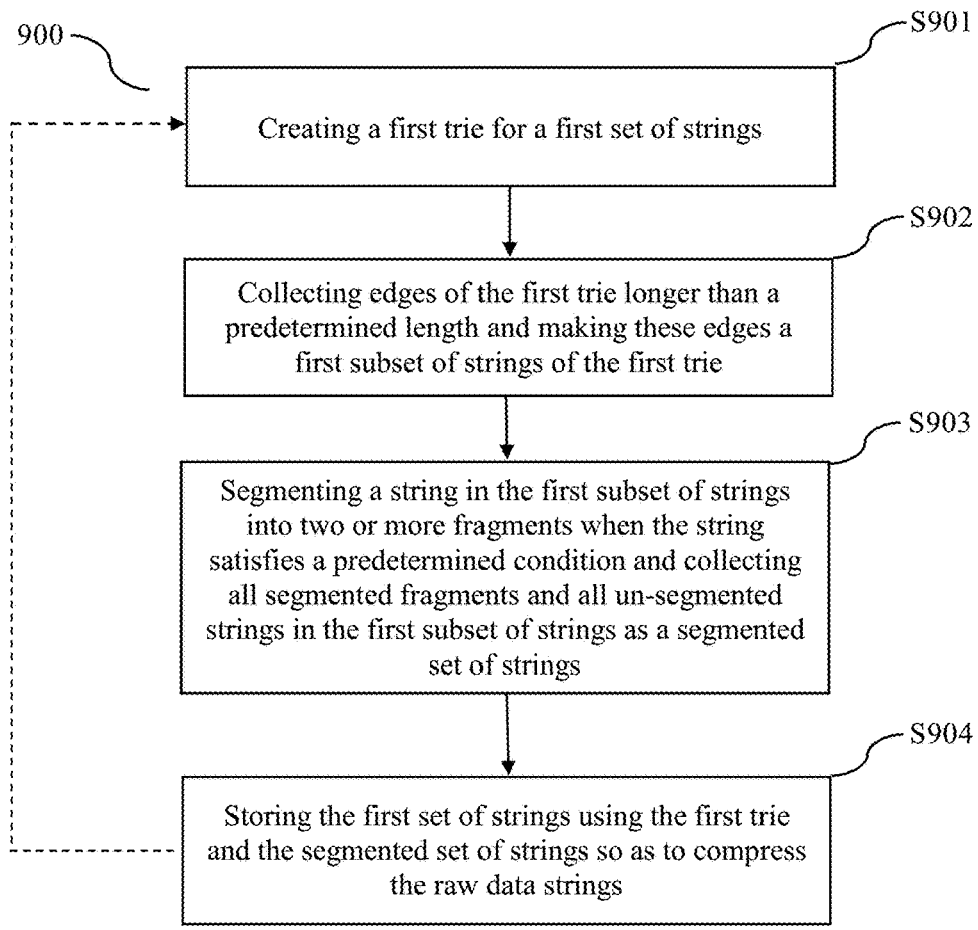
FIG. 9 is a flow chart of a method 900 for data compression according to embodiments of the present application.

FIG. 9 is a flow chart of a method 900 for data compression according to embodiments of the present application. Method 900 may include Steps 901-904.

In Step 901, a first trie is created for a first set of strings comprising a plurality of raw data strings. In one embodiment the first trie may be a PATRICIA trie that consists of multiple nodes linked through parent-child relation. Each edge of the trie represents a string including at least one character. In certain applications, the string corresponds to a certain input will trigger a state transition from a parent node of the edge to the child node of the edge. As described in connection with FIG. 2, a PATRICIA trie provides merged nodes that meet certain condition(s), and such a merged node has an edge consisting of at least one character.

In a preferable embodiment, in order to achieve a balance between compression efficiency and calculation overhead, nodes are merged in creating the PATRICIA trie only if characters included on the edge corresponding to the merged nodes reaches a predetermined number; otherwise, no nodes are merged and, thus each of the corresponding edges will have only one character. The predetermined number may be set flexibly based on specific applications. Those skilled in the art would readily appreciate that the predetermined number may be at least two and, preferably, three or a larger number.

In Step 902, edges of the first trie that are longer than a predetermined length are collected. These collected edges are made as a first subset of strings of the first trie.

As mentioned above, in the created trie, the lengths of the strings on the edges corresponding to the merged nodes are at least two and these strings are collected to generate a string subset. In one preferable embodiment, strings on the edges may first be reversed and the string subset may be made based on the reversed strings.

In Step 903, a string in the first subset of strings is segmented into two or more fragments when the string satisfies one or more predetermined conditions. Next, all the segmented fragments and un-segmented strings in the first subset of strings are collected as a segmented set of strings.

In one preferable embodiment, a string in the first subset of strings is segmented into multiple corresponding fragments if the length of the string reaches a predetermined value. Further, one or more predetermined characters included in the string may be identified as a segmentation mark. For example, the segmentation mark may be space(s), a tab character, a semicolon, or other characters. Alternatively, a string in the first subset of strings may be matched with a predetermined library of strings so as to find one or more fragments of the string that hit a match in the predetermined library. Those skilled in the art would appreciate that the ways of segmenting a string as described above are only illustrative and various other ways may also be conceived according to specific applications or characteristics of the strings.

In Step 904, the first set of strings comprising a plurality of raw data strings is stored using the first trie and the segmented set of strings.

In one preferable embodiment, the segmented set of strings is stored as a string array. Said string array is used in combination with the first trie to store the first set of strings.

In another embodiment, the segmented set of strings is made as a second set of strings. Next, as described in connection with FIG. 4 and by means of a nesting operation, a second trie and a second subset of strings may be created for the second set of strings in a way similar to the operations as described in Steps 901 and 902. As such, the first set of strings may be stored based on a nested structure of the first and second tries as well as the second subset of strings.

In another preferable embodiment, Steps 901-904 may be performed iteratively so as to create a multi-layer nested structure of tries. Thus, the first set of raw data strings may be retrieved based on the multi-layer nested trie structure and a set of strings corresponding to the innermost trie of the nested trie structure.

Illustration of the present application continues with the exemplary set of strings as shown in FIG. 6. In this example, the outer-layer compressed trie ($Trie_1$) created for the set of strings through the above Steps 901 and 902 is shown in FIG. 7.

Next, long strings labeled on edges in $Trie_1$ are segmented through the above Step 903. Here, as the long strings may include tab and space characters as delimiters, these delimiters may be identified as segmentation marks to segment the long strings. The segmented set of strings is shown in the table of FIG. 10. It is noted that, as the "g" in FIG. 7 is a string of one single character, it is not included in the segmented set of strings.

Next, in one embodiment, an inner-layer compressed trie ($Trie_2$) is created for the segmented set of strings of FIG. 10 through the above Step 904. The created $Trie_2$ is shown in FIG. 11. As is apparent from FIG. 11, more common prefixes may be generated among segmented fragments by segmenting strings corresponding to the compressed edges. As such, redundancy among strings may be more effectively reduced.

Further, related nodes in two or more tries may be associated with each other in order to recover an original un-segmented string. In one embodiment, a pointer pointing to a corresponding node in $Trie_2$ may be stored at the associated node in $Trie_1$, wherein a node in $Trie_2$ is associated with a corresponding string of the segmented set of strings.

Also in this example, after $Trie_2$ is created, if redundancy still exists among strings on the edges of $Trie_2$, the above steps may be repeated to implement nesting operation on $Trie_2$ such that a third-layer compressed trie ($Trie_3$) may be created. In the above example, as URLs usually have many common suffixes, strings on the compressed edges may first be reversed to convert suffixes to prefixes before the strings are used to create $Trie_3$.

To illustrate the reverse operation, both the segmented set of strings and the reversed segmented set of strings are shown in the table of FIG. 12.

As illustrated in FIG. 12, common suffixes ".html", ".htm", and "ong" are converted to common prefixes "lmth.", "mth.", and "gno" respectively so that redundancy among the strings may be utilized to compress the strings. Next, a created $Trie_3$ is shown in FIG. 13.

Those skilled in the art would appreciate that embodiments described above in connection with the set of strings consisting of search keywords and URL lists are merely illustrative and technical solutions proposed in the present application may be applied to other application scenarios and used to store data of varied characteristics. In one example, the proposed technical solutions may be used to store chat records for instant messaging software. In another example, the proposed technical solutions may be used to store web-page contents such as news, book reviews, or Wikipedia pages.

Those skilled in the art would also appreciate that tries (e.g. a PATRICIA trie) created in accordance with embodiments of the present application may be implemented as LOUDS tries according to the LOUDS representation as described above. As such, both forward search and reverse search of a string may be efficiently implemented through the rank and selection operations in a succinct data structure.

After tries are created for the set of raw data strings, another technical problem to be solved is how to efficiently store the set of strings at the innermost layer of the nested trie structure.

In the present application, it preferably provides a string array and each string in a string set may be addressed by a respective offset and length associated with the string array.

FIG. 14 and FIG. 15 depict an example of accessing a set of 20 strings by a string array.

Specifically, FIG. 14 depicts the string array created. The length of the string array is 23 bytes and the 23 characters in the array correspond to offsets 0~22 respectively.

Further, the table in FIG. 15 illustrates how to represent and retrieve the 20 strings in the set by using the string array: the offset value corresponding to each string identifies the starting position of the string in the array; and a corresponding number of characters are read from the array based on the length value corresponding to the string.

Space efficiency for storing a string set may be improved by using the above string array. Conventionally, n bytes are needed to store an n-character string and an additional byte is needed to store the length of the string. Thus, in the example of FIG. 15, 169 (i.e. 149+20) bytes are needed to store the string set. As a comparison, even if it is assumed that two bytes are used for each string to respectively represent its offset and length, only 63 (i.e. 23+20+20) bytes are needed to store the string set in the way proposed by the present application. Further, the storage space for each string may be further reduced if the lengths and offsets may be encoded in bits.

Similarly, in the example described above in connection with search keywords and URL lists, the set of strings corresponding to the compressed edges in $Trie_3$ as shown in FIG. 13 may be stored and represented according to the way described above.

Figure 16:
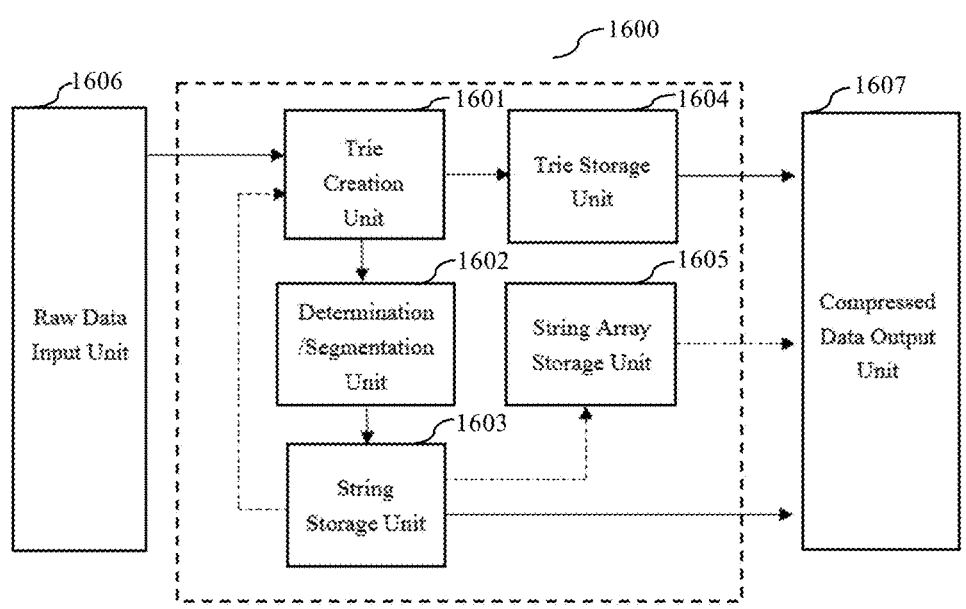
FIG. 16 depicts a system 1600 for data compression according to embodiments of the present application.

FIG. 16 depicts a system 1600 for data compression according to embodiments of the present application. In one preferable embodiment, the system may include: a trie creation unit (1601) for creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge, wherein edges of the first trie longer than a predetermined length are collected to form a first subset of strings of the first trie; a determination/segmentation unit (1602) for segmenting a string in the first subset of strings into two or more fragments when the string satisfies a predetermined condition, wherein all segmented fragments and all unsegmented strings in the first subset of strings are collected to form a segmented set of strings of the first trie; a string storage unit (1603) for storing the segmented set of strings; and a trie storage unit (1604) for storing the first trie.

In one embodiment, preferably, the determination/segmentation unit (1602) may identify one or more predetermined characters of a string in the first subset of strings as a segmentation mark and segment the string into fragments based on one or more identified segmentation marks. Alternatively, the determination/segmentation unit (1602) may match a string in the first subset of strings with a predetermined library of strings to find one or more fragments of the string that hit a match in the predetermined library and segment the string into matched fragments.

In one embodiment, the string storage unit (1603) may provide the segmented set of strings to the trie creation unit (1601) as a second set of strings; the trie creation unit (1601) may create a second trie and a second subset of strings for the second set of strings; the string storage unit (1603) may store the second subset of strings; and the trie storage unit (1604) may store the second trie. Preferably, the trie storage unit (1604) may associate a respective node of the first trie to a corresponding node of the second trie.

In one embodiment, a string array storage unit (1605) may store the second subset of strings as a string array, wherein each string in the second subset of strings is represented by a respective offset and length in the string array.

In one embodiment, the system may also include a raw data input unit (1606) for providing raw data associated with the first set of strings to the trie creation unit (1601).

In one embodiment, the system may also include a compressed data output unit (1607) for providing the compressed data based on data from the string storage unit (1603), the trie storage unit (1604), and the string array storage unit (1605).

The operation of the embodiments shown in FIG. 16 may be referred to the embodiments shown in FIG. 9, which will not be elaborated herein.

It should be noted that the structure of the embodiments shown in FIG. 16 are exemplary only, but not a limitation to the present application. In some cases, certain units can be added into or deleted from the embodiments shown in FIG. 16.

In some embodiments of the present application, some computer program products are provided, which have non-transitory computer readable storage medium including codes or instructions for performing the steps of the embodiments shown in FIG. 9. In some embodiments, the computer program product may be stored in the system or apparatus shown in FIG. 16.

The embodiments of the present application may be implemented by hardware, software or any combination thereof. The hardware may be implemented by specific logic circuits, and the software may be stored in a memory and executed by appropriate instruction executing systems. For example, the software may be executed by a micro-processor or a specifically designed hardware. Those skilled in the art may understand that the previous apparatus and method of the present application may be implemented by computer-executable instructions and/or control codes contained in the processor. For example, such codes may be provided in storage mediums such as hard disks, CD(s), DVD-ROM(s), programmable memories such as ROM(s), or data mediums such as optical or electrical signal mediums. An apparatus of the present application and its units may be implemented by hardware circuits including VLSI(s) or gate arrays, semiconductor circuits such as logic circuits or transistors, or programmable hardware devices such as FPGA(s) or PLD(s). An apparatus of the present application may also be implemented by software executable by various processors, or implemented by the combinations of the hardware and software such as firmware.

It should be noted that, although several units or sub-units of the apparatus have been described in the previous paragraphs, such division is not mandatory. The functions and features of two or more units described above may be embodied in a unit. Otherwise, the function and feature of one unit described above may be embodied in two or more units.

Furthermore, although the operation of a method according to the present application is illustrated with reference to the accompanying drawings in a specific sequence, the present application may be practiced using process flows that differ from that illustrated. Additionally, it should be noted that not all steps are required in every embodiment. In other words, one or more of the steps may be omitted or replaced, without departing from the spirit and scope of the invention. In certain embodiments, steps may be performed in different order, in parallel with one another, or omitted entirely, and/or certain additional steps may be performed without departing from the scope of the present application. In the claims, the word "comprising" does not exclude other elements or steps, and the indefinite article "a" or "an" does not exclude a plurality. A single processor or other unit may fulfill the functions of several items recited in the claims. The reference signs in the claims should not be construed as limiting the scope. The scope and spirit of the application is defined by the appended claims.

What is claimed is:

1. A method for data compression, comprising:
    (1) creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge;
    (2) collecting edges of the first trie longer than a predetermined length and making these edges a first subset of strings of the first trie;
    (3) segmenting a string in the first subset of strings into two or more fragments when the string satisfies a predetermined condition and collecting all segmented fragments and all un-segmented strings in the first subset of strings as a segmented set of strings; and
    (4) storing the first set of strings using the first trie and the segmented set of strings so as to compress the raw data strings.

2. The method of claim 1, wherein the step of segmenting the string in the first subset of strings comprises:

identifying one or more predetermined characters of a string in the first subset of strings as a segmentation mark; and segmenting the string into fragments based on one or more identified segmentation marks.

3. The method of claim 1, wherein the step of segmenting the string in the first subset of strings comprises:

matching a string in the first subset of strings with a predetermined library of strings to find one or more fragments of the string that hit a match in the predetermined library; and segmenting the string into matched fragments.

4. The method of claim 1, wherein the predetermined condition is that a length of the string reaches a predetermined value.

5. The method of claim 1, wherein the step of storing the first set of strings comprises:

providing the segmented set of strings as a second set of strings;

creating a second trie and a second subset of strings for the second set of strings; and storing the second set of strings using the second trie and the second subset of strings.

6. The method of claim 5, wherein the step of storing the first set of strings further comprises:

reversing the segmented set of strings; and providing the reversed segmented set of strings as the second set of strings.

7. The method of claim 5, wherein the step of storing the first set of strings further comprises:

associating a respective node of the first trie with a corresponding node of the second trie.

8. The method of claim 5, wherein the step of storing the first set of strings further comprises:

storing the second subset of strings as a string array, wherein each string in the second subset of strings is represented by a respective offset and length in the string array.

9. The method of claim 1, wherein the plurality of raw data strings comprise characters, numbers, and symbols in one or more languages.

10. The method of claim 1, wherein the plurality of raw data strings comprise search keywords and search suggestions matching the search keywords.

11. The method of claim 1, wherein the plurality of raw data strings comprise instant messaging chat records.

12. The method of claim 1, wherein the plurality of raw data strings comprise web-page contents.

13. The method of claim 1, wherein the first trie supports reverse search to facilitate access of the first set of strings.

14. The method of claim 13, wherein the first trie is implemented by a LOUDS (Level Ordered Unary Degree Sequence) trie.

15. The method of claim 14, wherein the LOUDS trie is operated by rank and select operations in succinct data structure.

16. An apparatus for data compression, comprising:

means for creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge;

means for collecting edges of the first trie longer than a predetermined length and making these edges a first subset of strings of the first trie;

means for segmenting a string in the first subset of strings into two or more fragments when the string satisfies a predetermined condition and collecting all segmented fragments and all unsegmented strings in the first subset of strings as a segmented set of strings; and means for storing the first set of strings using the first trie and the segmented set of strings so as to compress the raw data strings.

17. The apparatus of claim 16, wherein the means for segmenting the string in the first subset of strings comprises:

means for identifying one or more predetermined characters of a string in the first subset of strings as a segmentation mark; and means for segmenting the string into fragments based on one or more identified segmentation marks.

18. The apparatus of claim 16, wherein the means for segmenting the string in the first subset of strings comprises:

means for matching a string in the first subset of strings with a predetermined library of strings to find one or more fragments of the string that hit a match in the predetermined library; and means for segmenting the string into matched fragments.

19. The apparatus of claim 16, wherein the predetermined condition is that a length of the string reaches a predetermined value.

20. The apparatus of claim 16, wherein the means for storing the first set of strings comprises:

means for providing the segmented set of strings as a second set of strings;

means for creating a second trie and a second subset of strings for the second set of strings; and means for storing the second set of strings using the second trie and the second subset of strings.

21. The apparatus of claim 20, wherein the means for storing the first set of strings further comprises:

means for reversing the segmented set of strings; and means for providing the reversed segmented set of strings as the second set of strings.

22. The apparatus of claim 20, wherein the means for storing the first set of strings further comprises:

means for associating a respective node of the first trie with a corresponding node of the second trie.

23. The apparatus of claim 20, wherein the means for storing the first set of strings further comprises:

means for storing the second subset of strings as a string array, wherein each string in the second subset of strings is represented by a respective offset and length in the string array.

24. The apparatus of claim 16, wherein the plurality of raw data strings comprise characters, numbers, and symbols in one or more languages.

25. The apparatus of claim 16, wherein the plurality of raw data strings comprise search keywords and search suggestions matching the search keywords.

26. The apparatus of claim 16, wherein the plurality of raw data strings comprise instant messaging chat records.

27. The apparatus of claim 16, wherein the plurality of raw data strings comprise web-page contents.

28. The apparatus of claim 16, wherein the first trie supports reverse search to facilitate access of the first set of strings.

29. The apparatus of claim 28, wherein the first trie is implemented by a LOUDS (Level Ordered Unary Degree Sequence) trie.

30. The apparatus of claim 29, wherein the LOUDS trie is operated by rank and select operations in succinct data structure.

31. A system for data compression, comprising:
a trie creation unit (1601) for creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge, wherein edges of the first trie longer than a predetermined length are collected to form a first subset of strings of the first trie;
a determination/segmentation unit (1602) for segmenting a string in the first subset of strings into two or more fragments when the string satisfies a predetermined condition, wherein all segmented fragments and all unsegmented strings in the first subset of strings are collected to form a segmented set of strings of the first trie;
a string storage unit (1603) for storing the segmented set of strings; and
a trie storage unit (1604) for storing the first trie.

32. The system of claim 31, wherein the determination/segmentation unit (1602) identifies one or more predetermined characters of a string in the first subset of strings as a segmentation mark and segments the string into fragments based on one or more identified segmentation marks.

33. The system of claim 31, wherein the determination/segmentation unit (1602) matches a string in the first subset of strings with a predetermined library of strings to find one or more fragments of the string that hit a match in the predetermined library and segments the string into matched fragments.

34. The system of claim 31, wherein,
the string storage unit (1603) provides the segmented set of strings to the trie creation unit (1601) as a second set of strings;
the trie creation unit (1601) creates a second trie and a second subset of strings for the second set of strings;
the string storage unit (1603) stores the second subset of strings; and
the trie storage unit (1604) stores the second trie.

35. The system of claim 34, wherein the trie storage unit (1604) associates a respective node of the first trie with a corresponding node of the second trie.

36. The system of claim 34, wherein the system further comprises:
a string array storage unit (1605) stores the second subset of strings as a string array, wherein each string in the second subset of strings is represented by a respective offset and length in the string array.

37. An apparatus for data compression, comprising:
a memory;
a processor coupled to the memory, wherein the processor is configured to:
create a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge;
collect edges of the first trie longer than a predetermined length and make these edges a first subset of strings of the first trie;
segment a string in the first subset of strings into two or more fragments when the string satisfies a predetermined condition and collect all segmented fragments and all unsegmented strings in the first subset of strings as a segmented set of strings; and
store the first set of strings using the first trie and the segmented set of strings so as to compress the raw data strings.

38. A computer program product for data compression, comprising:
a non-transitory computer-readable medium comprising computer-executable codes for:
creating a first trie for a first set of strings, the first set of strings comprising a plurality of raw data strings, wherein a trie consists of a plurality of nodes linked through parent-child relation, and wherein each edge of the trie is of at least one character and the edge corresponds to a state transition from a parent node of the edge to a child node of the edge;
collecting edges of the first trie longer than a predetermined length and make these edges a first subset of strings of the first trie;
segmenting a string in the first subset of strings into two or more fragments when the string satisfies a predetermined condition and collecting all segmented fragments and all unsegmented strings in the first subset of strings as a segmented set of strings; and
storing the first set of strings using the first trie and the segmented set of strings so as to compress the raw data strings.

* * * * *